(12) United States Patent
Meissner

(10) Patent No.: US 8,802,480 B2
(45) Date of Patent: Aug. 12, 2014

(54) METHOD FOR THE PRODCUTION OF A MONOGRAIN MEMBRANE FOR A SOLAR CELL, MONOGRAIN MEMBRANE, AND SOLAR CELL

(75) Inventor: Dieter Meissner, Büchen (DE)

(73) Assignee: crystalsol GmbH, Vienna (AT)

( * ) Notice: Subject to any disclaimer, the term of this patent is extended or adjusted under 35 U.S.C. 154(b) by 427 days.

(21) Appl. No.: 13/001,340

(22) PCT Filed: Jun. 10, 2009

(86) PCT No.: PCT/EP2009/057127
§ 371 (c)(1),
(2), (4) Date: Dec. 23, 2010

(87) PCT Pub. No.: WO2010/000581
PCT Pub. Date: Jan. 7, 2010

(65) Prior Publication Data
US 2011/0114157 A1    May 19, 2011

(30) Foreign Application Priority Data
Jul. 3, 2008 (DE) .......................... 10 2008 040 147

(51) Int. Cl.
*H01L 21/00* (2006.01)

(52) U.S. Cl.
USPC ......... 438/66; 257/E31.11; 136/250; 438/800

(58) Field of Classification Search
USPC ................ 438/800, 66; 136/250; 257/E31.11
See application file for complete search history.

(56) References Cited

U.S. PATENT DOCUMENTS 3,247,477 A    10/1962 Fridrich
3,615,854 A * 10/1971 Aten .............................. 136/250

(Continued)

FOREIGN PATENT DOCUMENTS

EP    1 521 309    2/1990
EP    1 521 308    10/2003

(Continued)

OTHER PUBLICATIONS

German Search Report dated Jul. 3, 2008 for corresponding German Patent Application No. 10 2008 040 147.1.

(Continued)

*Primary Examiner* — Kimberly Rizkallah
*Assistant Examiner* — Caleb Henry
(74) *Attorney, Agent, or Firm* — Renner, Otto, Boisselle & Sklar, LLP

(57) ABSTRACT

The invention relates to a method for producing a monograin membrane and a monograin membrane produced according to said method. The invention further relates to the production of a solar cell from such a monograin membrane as well as a produced solar cell. The monograin membranes produced according to the invention can also be used for other applications, e.g. for converting electric energy into radiation energy or in detectors for detecting radiation. The aim of the invention is to improve the production of monograin membranes and solar cells. Said aim is achieved by first preparing a horizontally oriented layer made of a binder that is not yet cured or cross-linked such that the binder is liquid or at least viscous. Grains are partially introduced into the layer through a surface of the layer in such a way that only a portion of each grain is immersed in the layer and a zone of the grain remains above the surface of the layer. As a result, the zone of the grain that remains above the surface of a binder is definitely not moistened by a binder. The binder is then solidified, e.g. in a curing or cross-linking process. The obtained monograin membrane comprises grains which protrude on one side and the surface of which is definitely not provided with binder or binder residues or any other glues, adhesives, or glue residues.

7 Claims, 7 Drawing Sheets

(56) References Cited

U.S. PATENT DOCUMENTS

Figure 1:
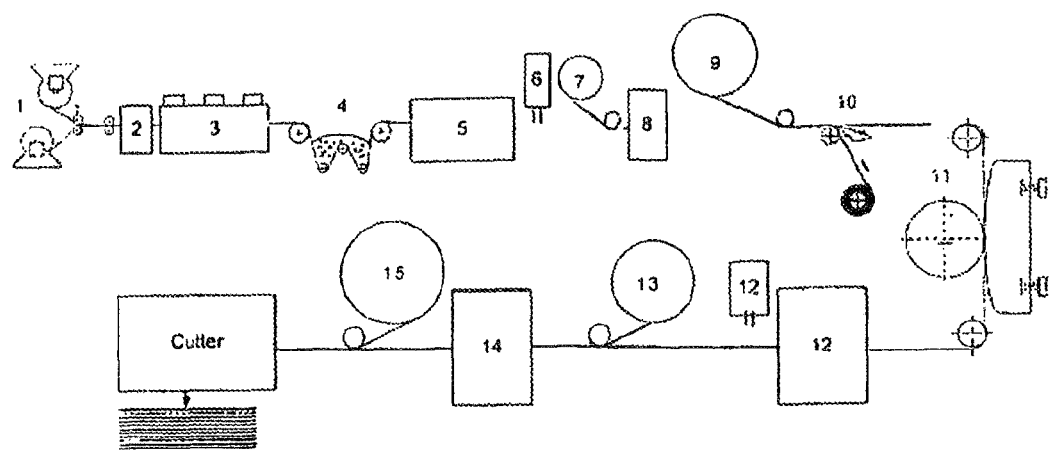

| | | | |
|---|---|---|---|
| 3,787,277 A * | 1/1974 | Oomen et al. | 442/8 |
| 3,998,659 A * | 12/1976 | Wakefield | 136/250 |
| 4,021,323 A * | 5/1977 | Kilby et al. | 136/246 |
| 4,136,436 A * | 1/1979 | Kilby et al. | 438/63 |
| 4,521,640 A | 6/1985 | Levine | |
| 4,614,835 A * | 9/1986 | Carson et al. | 136/250 |
| 5,672,214 A * | 9/1997 | Arthur et al. | 136/250 |
| 6,437,234 B1 * | 8/2002 | Kyoda et al. | 136/250 |
| 6,488,770 B1 * | 12/2002 | Meissner et al. | 117/73 |
| 6,762,359 B2 * | 7/2004 | Asai et al. | 136/250 |
| 7,602,035 B2 * | 10/2009 | Nakata | 257/456 |
| 7,947,894 B2 * | 5/2011 | Nakata | 136/250 |
| 8,338,690 B2 * | 12/2012 | Murozono et al. | 136/243 |
| 8,581,091 B2 | 11/2013 | Geyer et al. | |
| 2007/0089780 A1 | 4/2007 | Geyer et al. | |
| 2007/0089782 A1 | 4/2007 | Scheuten et al. | |
| 2007/0113888 A1 * | 5/2007 | Geyer et al. | 136/262 |
| 2007/0189956 A1 * | 8/2007 | Geyer et al. | 423/508 |

FOREIGN PATENT DOCUMENTS

| | | |
|---|---|---|
| EP | 1521308 | 10/2003 |
| EP | 1521309 | 10/2003 |
| FR | 1 372 154 | 9/1964 |
| JP | 03-228379 | 2/1990 |
| JP | 04-207085 | 11/1990 |
| JP | 4-207085 | 7/1992 |
| JP | 2002-164551 A | 6/2002 |
| JP | 2007-507867 A | 3/2007 |
| JP | 2007-534151 | 11/2007 |

OTHER PUBLICATIONS

English translation of IRPR Report for corresponding International Application No. PCT/EP2009/057127 dated Nov. 15, 2011.

Mellikov et al., "Monograin Materials for Solar Cells", Jun. 10, 2006, pp. 65-68, Solar Energy Materials and Solar Cells, Elsevier Science Publishers, Amsterdam, NL, vol. 93, No. 1.

* cited by examiner

METHOD FOR THE PRODCUTION OF A MONOGRAIN MEMBRANE FOR A SOLAR CELL, MONOGRAIN MEMBRANE, AND SOLAR CELL

The invention relates to a method for producing a monograin membrane as well as to a monograin membrane produced in accordance with the method. The invention moreover relates to the production of a solar cell from a produced monograin membrane as well as to a produced solar cell. However, the monograin membranes produced according to the invention may also be used in a different manner, for example for the conversion of electrical energy into radiation energy, or in detectors for radiation detection. However, other applications such as the use in the production of screens for screen printing etc. are also possible.

A monograin membrane is a membrane with grains, spherules or particles embedded therein in a single plane. The thickness of the membrane corresponds to the diameter of the grains, wherein the term grains hereinafter basically also denotes spherules or particles unless otherwise expressly stated. As a rule, the thickness of the membrane is less than the diameter of the grains contained therein, so that they protrude from at least one membrane surface. The membrane as a rule consists of an electrically non-conductive binder, such as for example an electrically non-conductive polymer. The grains consist in particular of a material which is capable of converting radiation, in particular sunlight, into electrical energy and/or emits radiation and generates it from electrical energy. As a rule, the grains are electrical semiconductors.

Monograin membranes, which have a thickness of only about a single grain, have various advantages over thicker membranes. For example, transition resistances between the grains are avoided. Good efficiency factors can be obtained due to the fact that no grain shields another grain. Moreover, a beneficial ratio between material weight to effective surface is obtained.

Monograin membranes and solar cells produced therefrom are known, for example, from US 2007/0189956 A1 or US 2007/113888 A1.

Document DE-AS 1 764 873 describes a photosensitive device with a monograin membrane containing photosensitive grains or particles. The photosensitive grains consist, for example, of cadmium sulfide doped with 0.1 to 0.01 atomic percent copper. The diameter of the grains is about 40 μm. The grains are held together by an insulating binder, which is a polyurethane resin. The grains protrude approximately equally far relative to both sides of the membrane. The photosensitive layer has a thickness of about one grain diameter and is therefore referred to as a monograin membrane or a monoparticle membrane. The monograin membrane is provided with at least two electrodes to which one connecting lead, respectively, is connected. In order to now minimize the obstruction of incident light, the electrodes, which consist of indium and are, in particular, 0.3 μm thick, are only attached on one side of the layer. A preferably 100 Angström thick auxiliary electrode which also consists of indium is preferably located on an opposite side. The monograin membrane with the attached electrodes and auxiliary electrodes can be embedded in plastic.

Document U.S. Pat. No. 3,522,339 A discloses a method for the production of a monograin membrane. The grains consist of a semiconductor material with p-n transitions. A thin, liquid bonding layer consisting of, for example, gelatin or water-soluble saccharides, into which the grains are sunk to a small extent, is applied onto a carrier. The grains are coated with a liquid binder, namely a photoresist. The photoresist is then exposed in such a manner that, if possible, only the regions between the grains become insoluble. The unexposed regions are removed by means of a developing process. Then, the bonding layer is washed off from parts of the surface of the grains. The uncovered surfaces of the grains are coated with a transparent electrode of a thickness of, for example, 100 Angström, which consists, for example, of copper. The electrode can be coated with a transparent epoxy resin in order to stabilize the structure. The bonding layer is then washed off and an ohmic contact is established between the protruding grains and a layer consisting of indium.

Furthermore, it is also known from document U.S. Pat. No. 3,522,339 A to provide grains of an n-conducting material with an enveloping layer of p-conducting material so that a p-n transition is formed between the core and the enveloping layer. The grains are partially sunk into a liquid bonding layer, after which the bonding layer is cured. The enveloping layer is then etched off the grain portions protruding from the bonding layer, the grains protruding from the bonding layer are covered with a curable binder. After the binder has cured, the bonding layer is removed and contacted with a transparent electrode. The opposite side is abraded, the grains are thus partially uncovered and are also contacted with an electrode.

One drawback is that ablations have to take place on two sides in both methods, which increases the amount of work. Moreover, there is therefore an increased risk of incomplete ablation, which reduces the efficiency factor.

It is known, from document FR 1372 154, to press grains and a curable binder in between two films, during which the tips of the grains press into the films. A monograin membrane with protruding grains regions free from binder is thus to be obtained. Disadvantageously, however, the grains have to be exposed to a relatively large pressure. During the production, the grains first dip into the binder completely and are completely wetted with the binder. Therefore, it cannot be reliably excluded that the binder is removed again from the grain surface to the intended extent. Moreover, a continuous production is not possible with this method. The result is a membrane from which the grains protrude equally far relative to both surfaces.

A spherical semiconductor component for use in solar cells is known from document EP 1521308 A1 which comprises a substrate core consisting, in particular, of glass and which is coated with at least one back contact layer and a I-III-VI compound semiconductor. By providing a substrate core, relatively expensive semiconductor material is saved. The spherules are applied onto a carrier layer located on a flexible support and pressed into the carrier layer to such an extent that parts of the spherules exit at the underside of the carrier layer and opposite parts are not pressed completely into the carrier layer. The compound semiconductor is removed down to the back contact layer on one side. Both sides are finally covered with electrodes in a suitable manner, with one electrode consisting of a transparent material.

In addition, document EP 1521309 A1 discloses a method for the production of an electrical serial circuit of solar cells with integrated semiconductor bodies. One or more electrically conductive bodies are first introduced into an insulating carrier layer, with the conductive bodies protruding on at least one side of the carrier layer from the surface of the carrier layer, so that a dividing line is formed by the conductive bodies. Semi-conductive grains or spheres are introduced into the insulating carrier layer so as to protrude at least on one side of the carrier layer. Parts of the semi-conductive grains are removed on one side of the carrier layer. A back contact layer is applied on the side with the removed grains. A front contact layer is applied onto the other side. Separating cuts are carried out in the two contact layers in such a way that the desired serial circuit is obtained. Beyond this, it is difficult to prevent contacts to the conductive regions. For this purpose, structures must be generated in practice prior to the introduction of the spheres or grains that permit a positioning of all particles.

The aforementioned prior art is disadvantageous in that the introduction of the semiconductors and of the conductive bodies can be implemented in practice only with great difficulties. Since the semi-conductive grains have to be pressed into a carrier, a relatively high pressure must be exerted which could damage the grains.

From document U.S. Pat. No. 4,521,640, it is known to embed semi-conductive particles into plastic films and to contact them on two sides.

The features known from the aforementioned prior art can be combined individually or in combination with the features of the present invention unless otherwise stated below.

The present invention pursues the aim of being able to produce monograin membranes and solar cells in an improved manner.

The object of the invention is achieved by a method having the features of the first claim. The independent claim relates to a monograin membrane produced in accordance with the method.

In order to achieve the object, first, a horizontally oriented layer consisting of a binder is provided. In contrast to the prior art known from document EP 1521309 A1, the binder is not yet cured or cross-linked so that the binder is liquid or at least viscous. The binder therefore does not constitute a carrier layer. Instead, it is located above or on the carrier layer. In the layer, grains are, in particular, introduced into the layer only partially, namely through a surface of the layer into the layer. To partially introduce grains means that, after the partial introduction, only a part of each grains dips into the layer and that consequently, preferably a region of the grain remains above the surface of the layer. It is thus accomplished that the region of the grain remaining above the surface of a binder is reliably not wetted with a binder. The binder is subsequently solidified, for example by curing or cross-linking. A monograin membrane with grains protruding on one side is now provided whose surface is definitely provided neither with binder nor binder residues, nor with other adhesives or bonding agents or adhesive residues. This method can be carried out continuously without any trouble. The carrier in that case consists of a web which is reeled off from a roller or reel, for example. First, the binder is continuously applied, for example printed, onto this reel. Then, the grains or spheres are continuously applied, for example sprinkled on. The grains are pressed into the binder for example by a following roller, or the grains sink into the binder by themselves. The desired monograin membrane can thus be produced continuously and automatically.

If the grains are introduced into the binder only partially so that the grains protrude partially, then no measures for removing binder or adhesives need be carried out on that side which always entail the risk of a removal being successful only incompletely and which, furthermore, mean an additional process step. In particular if the grains or spheres do not have a smooth surface (which is always the case in the prior art mentioned in the introduction) it is, as a rule, impossible in the prior art to accomplish that all exposed surfaces of the grains do not have any binder residues or adhesives residues anymore. Since in one embodiment of the invention, grains are at first only applied only onto the surface of the layer consisting of a binder and then, a part of a grain sinks in partially or is gently pressed in partially using gentle pressure, the binder in that case cannot wet the grains completely. It is thus ensured that these exposed surfaces of the grains are definitely not undesirably provided with binder residues or the like.

Moreover, it is not necessary according to the invention to subject grains or spheres to a high pressure which could damage the grains. Moreover, it is not necessary to prevent the grains or spheres coming into contact with the conductive regions located in the layer or that they are pressed into them.

Apart from the deviations caused by adhesion, which occur on the boundaries of the grains, the surface of the binder basically runs rectilinear due to the production method. The underside of the binder also basically extends in a rectilinear manner because a carrier for the layer consisting of the binder generally is flat. On the whole, the result is a geometry and design of a monograin membrane comprising protruding grain surfaces that have never come into contact with the binder and which therefore do not comprise any binder residues.

In order to be able to manufacture a solar cell from a monograin membrane, the grains in one embodiment consist of a material that is capable of converting sunlight into electrical energy. For the production of a solar cell, the protruding part of the grains is provided with a layer by means of which a p-n transition is provided, which is hereinafter referred to as p-n coating. The core of the grain in that case consists, in particular, of an n-conducting material enveloped with a p-conducting layer. Though in principle the outer layer can also be n-conducting and be located on a p-conducting region. In principle, sunlight or, generally, electromagnetic radiation should first be incident on the p-conducting layer in order to arrive at efficient solar cells. In order to be able to draw off current in a suitable manner from the grains, the binder consists of an electrically non-conductive material. The result is a monograin membrane in which the grains are partially embedded in an electrical insulator.

The grains preferably protrude partially relative to a surface of the insulator by the grains having been introduced into the binder only partially. The protruding part of the grains is provided with a p-n coating. Due to the production method, the p-n coating moreover continues into the insulator.

A Schottky contact or another barrier for a charge carrier can be provided instead of a p-n coating in order thus to be able to generate a current using an electromagnetic radiation.

In one embodiment, the grains are wholly or substantially monocrystalline, preferably polycrystalline. The crystalline structure makes high efficiency factors possible. Polycrystalline grains can be produced comparatively inexpensively and are therefore to be particularly preferred. It is possible that only the core of a grain is crystalline.

The grains consist, in particular, of Si, Ge, GaAs, CdTe, CdSe, CuInSe$_2$, InP, PbS, SbS or CuZnSnSSe. The p-n transitions are provided as a result of, for example, a suitable doping or a suitably modified composition. For example, silicon or germanium can be doped on the inside with boron and on the outside with arsenic or phosphorus in order to obtain a p-n transition. The respective doping concentration is typically $10^{15}$ to $10^{20}$ doping atoms per cm$^3$. In the case on GaAs, there is an excess of Ga on the inside and As on the outer layer in order thus to obtain a p-n transition. The same applies, mutatis mutandis, for the other compound semiconductors mentioned.

In the case of CuZnSnSSe, n-conducting CdSu is applied onto the surface in order thus to be able to produce grains with a p-n coating from less expensive materials.

The diameter of the grains is in particular 5 μm to 5 mm, preferably at 10 to 50 μm. The coating of the grains for forming a p-n transition has a thickness of in particular 100 nm to 2 μm. If grains protrude relative to a binder surface, they protrude, in particular, by 1 to 5 μm.

The grains can comprise a core consisting of, for example, glass, in order to save on expensive semiconductor materials. However, the ohmic resistance that the generated current must overcome is thus increased.

If a solar cell, a detector or a comparable component, in which two sides of the grains are to be contacted, is to be produced from such a monograin membrane, the grains are introduced into the insulator or the electrically non-conductive binder in such a manner that they at least reach the opposite surface of the insulator. If the insulator is located on a soft adhesive layer or a comparably soft layer, the grains preferably extend into the soft layer to some extent or have been pressed into the soft layer. After the removal of the soft layer, the exposed grains are preferably polished or the like, so that the envelope in this region, which is referred to as the p-n coating, is removed. Because the envelope of the grain is removed, it is ensured at the same time that no binder residues or residues of the soft layer have disadvantageously remained on the surface thus exposed.

Basically, because of the ablation of the p-n coating, this exposed region of the grains is located in a single plane or at least substantially in a single plane with the adjacent surface of the binder. Grains then do not protrude from that side of the layer formed from the binder.

In one embodiment of the invention, the material of the binder is selected such that it is harder than the material of the grains. It is thus accomplished that polishing results in the material of the grains being removed faster than the binder. This ensures particularly reliably that the grains are removed to the desired extent. As a rule, the grains in the polished region are then curved like a hollow sphere towards the inside relative to the surface of the binder, because the grains are ablated faster than the binder.

In one embodiment of the invention, the adhesive layer can be dissolved by a liquid. Particularly preferably, the adhesive layer is water-soluble in order to be able to wash off the adhesive in an environmentally friendly and inexpensive manner and thus remove it. The adhesive layer can be applied directly onto a carrier. In order to be able to reliably remove the adhesive layer easily even in a solidified state, a bonding layer can be located between the carrier and the adhesive layer.

In order to be able to continuously produce monograin membranes for solar cells, a web is produced on the carrier in one embodiment which consists of alternating sections. The sections extend along the web and therefore extend parallel to the web-like carrier in a web-like or strip-like manner. A first section comprises the aforementioned layer comprising the electrically non-conductive binder and the grains protruding therefrom. A second section adjacent thereto comprises a layer or regions of electrically conductive material. These two sections, layers or regions alternate once or several times and thus define the total width of the web. For the reasons stated below, this structure enables a continuous manufacturing process for solar cells electrically connected with each other in series. A cost-effective production on a large scale is thus made possible. The result is a membrane comprising sections or regions formed by an electrical insulator with grains located therein, wherein these sections are separated from one another by web-like or strip-like electrically conductive regions. A region is electrically conductive in the sense of the invention if a transport of electrical current through the region is possible. It is sufficient if the electrically conductive region is formed by a plurality of electrically conductive particles that need not be electrically connected to one another. The particles only have to enable current transport from a back contact to a front contact or frontal contact of solar cells and in this sense enable the transport of current through the region. This can include wires forming the electrically conductive region. Metal or graphite, for example, is suitable as an electrically conductive material.

The carrier in particular consists of an aluminum film, steel film, polyester film or Teflon film. The thickness of the film is, in particular, some 10 to some 100 μm, for example 100 μm. The film should be flexible to such an extent that it can be reeled off from a reel for the purpose of continuous fabrication. The thickness of the film is selected accordingly. Carrier films consisting of metal are to be preferred because in that case the carrier film is sufficiently free from distortion to be able to fabricate in the manner described below.

Because the electrically conductive regions only serve for transporting current, they are preferably designed to be narrow in order to thus minimize the required space advantageously. An electrically conductive region is designed narrow in the sense of the invention if the width of the region is narrower than the width of the adjacent electrically insulating layers with the grains located therein.

In order to optimize a solar cell, the layer of electrically non-conductive material with the protruding grains is thus several times wider than the adjacent regions comprising the electrically conductive material. The region generating the current is in that case large as compared to the regions that merely serve for conducting current through from a back contact to a front contact.

In one embodiment of the invention, the electrically conductive region consists of an electrically conductive binder. This embodiment is advantageous in that the electrically conductive region can be applied in a single fabrication step onto the carrier together with the electrically non-conductive binder, for example with particular ease and accuracy by means of a printing process.

In order to ensure in a simple manner that each grain gets into the layer consisting of a binder only partially, the layer is located above a carrier consisting of a solid into which the grains cannot sink. The distance between the surface of the carrier and the surface of the layer consisting of a binder is less than the diameter of the grains that are only partially introduced into the layer consisting of a binder. Since the grains cannot penetrate into the carrier, it is thus definitely accomplished that the grains do not completely sink into the layer consisting of a binder.

In one embodiment of the method, it comprises the following steps: an electrically non-conductive binder and an electrically conductive binder are applied adjacent to one another in a web-like or strip-like manner onto a surface of a web-like carrier, said surface being sticky and/or provided with adhesive. Then, the grains provided with a coating for forming a p-n transition (referred to as "p-n coating") are introduced into the electrically non-conductive binder with a partial area, respectively, of each grain, so that the grains extend at least up to the surface of the web-like carrier that is sticky and/or provided with adhesive, thus touching these sticky or adhesive layers. It does no harm if the grains also get into the electrically conductive regions. Thus, the grains can be evenly sprinkled onto the binders. This simplifies the method considerably because no attention need be paid to the spatial distribution of the particles. Moreover, no disturbances can occur due to the fact that the electrically conductive regions consist of a solid into which the grains cannot sink.

The surfaces of the electrically non-conductive and conductive layers or webs thus produced are covered in a web-like manner, section by section, with a transparent, electrically conductive material in such a way that each web-like section is electrically connected only to a single underlying electrically conductive layer, and conversely, each underlying electrically conductive layer is electrically connected only to a single web-like, electrically conductive, transparent section. Then, the carrier and the sticky surface or adhesive surface are removed together with the directly adjacent p-n coating, in particular by washing it off. The surface thus exposed is covered in a web-like manner and section by section with an electrically conductive material in such a way that each web-like section is electrically connected only to a single underlying electrically conductive layer, and conversely, each underlying electrically conductive layer is electrically connected only to a single web-like, electrically conductive section, so that individual solar cells are electrically connected with each other in series. Two outer electrically conductive sections connected to each other by an electrically conductive intermediate layer then cover different layers with the protruding grains. The electrically conductive sections constitute the front and back contacts of the solar cells.

After these steps have been completed, a functional solar module is already available which comprises several solar cells electrically connected in series.

The electrically non-conductive regions with the grains located therein are preferably 3 to 20 mm wide in order thus to have available, on the one side, a sufficiently wide layer in which electrical current is generated, and to not have to accept losses that are too large due to ohmic resistances. The electrically conductive regions preferably are no wider than 1 mm because they do not contribute to the current generation, but are only part of the electric serial circuit.

IN THE ACCOMPANYING DRAWINGS

FIG. 1 is a schematic of a production installation for carrying out a method of producing a monograin membrane in accordance with the invention; and FIGS. 2-14 are cross-sectional views showing a monograin membrane at various stages of production.

FIG. 1 presents an overview over the sequence of the individual process steps. The production installation first comprises means 1 for feeding a carrier film consisting of, for example, metal or a polymer into a subsequent processing station 2. The carrier film, which consists in particular of 100 μm thick steel, is, for example, reeled off from a reel and fed to the processing station 2 via guide rollers. Preferably, the feeding means 1 comprise two rollers in order to be able to feed the carrier film to a second roller as quickly as possible once the carrier film of a first roller has been used up.

Figure 2:
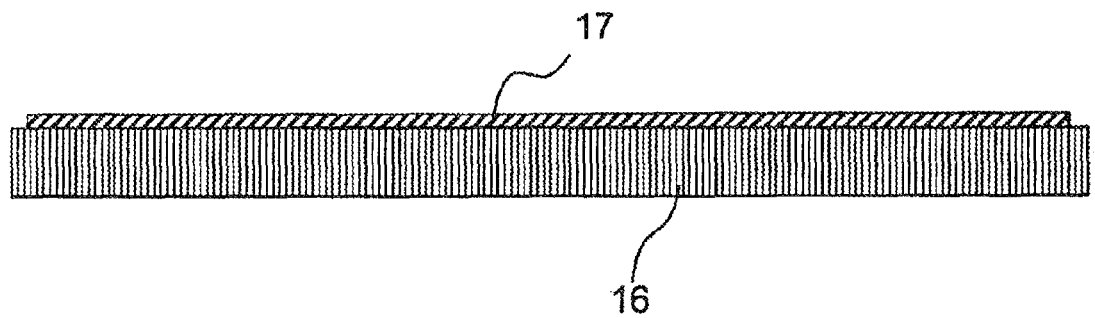

The carrier film, which is typically 0.05 to 0.5 mm thick and typically 70 to 120 cm wide, is transported into the processing station 2 horizontally. In the processing station 2, a layer consisting of an adhesive, hereinafter referred to as adhesion layer, is applied onto the surface of the carrier film 16. The adhesion layer applied has a thickness of, for example, 1 to 2 μm. FIG. 2 shows a section along the width of the film 16 with the adhesion layer 17 located thereon. The adhesion layer can be applied, for example, by means of a printing process.

The adhesion layer in particular consists of gum arabic or a conventional photo glue. At first, the objective of using the adhesive is only that the applied subsequent layers stick and can be removed again from the carrier. The adhesive of the adhesive layer is to be chosen accordingly. It is advantageous if the adhesive layer is sufficiently soft at all times so that grains can be pressed into the adhesive layer a little without exerting large forces.

Figure 3:
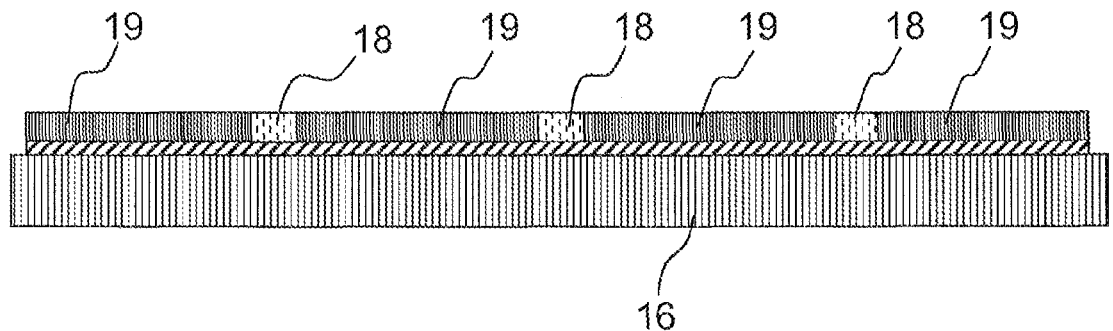

After the adhesion layer 17 has been applied, the coated carrier film arrives at a processing station 3 in which electrically conductive polymers 18 and non-conductive polymers or binder 19 are applied adjacent to one another in a web-like manner, in particular by means of a printing process. The web-like or strip-like sections extend perpendicularly to the width of the carrier film, that is, along the carrier film web. FIG. 3 shows the applied sections 18 and 19 in a cross section. The electrically conductive polymer webs 18 are applied, for example, as graphite-containing suspensions. The applied webs 19 can consists of, for example, epoxy resins. The thickness of the applied polymer webs is typically 5 to 20 μm, preferably at least 20 μm. The width of an electrically non-conductive web 19 is preferably substantially wider than the width of an electrically conductive web 18, namely in particular at least twice as wide, particularly preferably at least three times as wide, in order thus to obtain large active surfaces relative to the electrically conductive sections 18.

Suitable electrically conductive polymers consist, in particular, of polyacetylene, polyaniline, or they are composites with electrically conductive particles. Suitable electrically non-conducting binders are polyester resins or polyester resin-based binders. Suitable electrically non-conductive binders are commercially available, for example under the designation Epikote 828, 838 and 1001.

Photoactive particles or grains 20 are now introduced into the still-soft, web-like, electrically non-conductive layers 19. This takes place in a processing station 4 shown in FIG. 1. The photoactive grains are capable of converting solar energy into electrical energy. The diameters of the grains are larger than the thickness of the electrically non-conductive polymer webs 19 including the adhesion layer 17, so that the introduced grains do not completely dip into the polymer webs. The particles 20 can be sprinkled on and then sink into the polymer web due to gravity until the sinking process is stopped by the adhesion layer 17 or the carrier 16. If so required, or in order to accelerate the process, the particles can also be pressed into the polymer webs 19. It is not a critical issue if particles 20 contact the electrically conductive webs 18. The diameter of the particles, grains or spherules 20 is larger than the thickness of the layers 19, for example 1 mm.

The photoactive particles 20 are already coated in such a way that there is a p-n transition.

Figure 4:
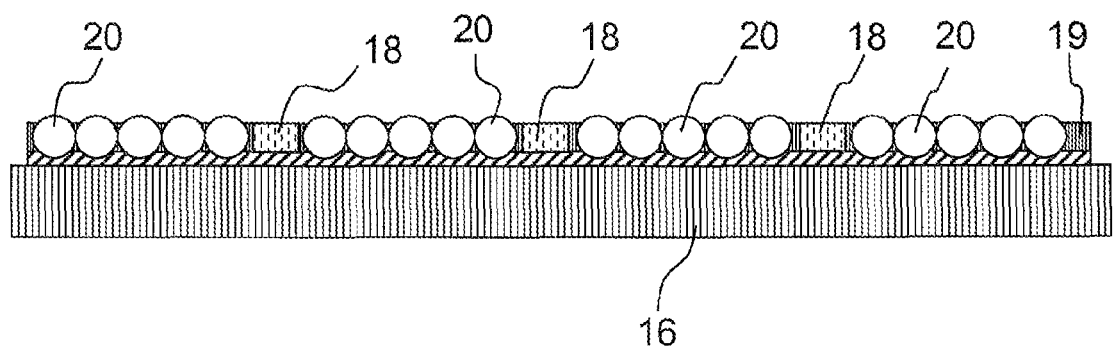

In a sectional view, FIG. 4 illustrates the state in which the grains 20 have been partially introduced into the webs 19 and are contacting the adhesion layer 17. Though the grains 20 are shown to be exactly circular, this is generally not the case.

Figure 5:
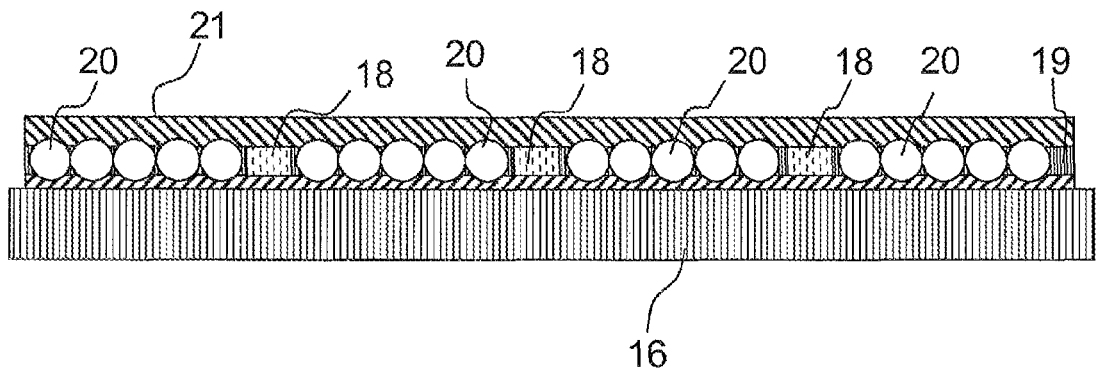

In a subsequent station 5, a transparent electrically conductive layer 21, which consists, for example, of zinc oxide or of $InSnO_3$ or generally of ITO, is applied onto the polymer webs 19 comprising the protruding particles 20. Application can take place by a printing technique or by sputtering. As FIG. 5 shows, the electrically conductive, transparent coating 21 contacts both the particles 20 as well as the electrically conductive webs 18 electrically. Application can be carried out directly in a patterned manner, or at first cover the entire surface both of the electrically conductive layers 18 as well as the electrically non-conductive layers 19.

Figure 6:
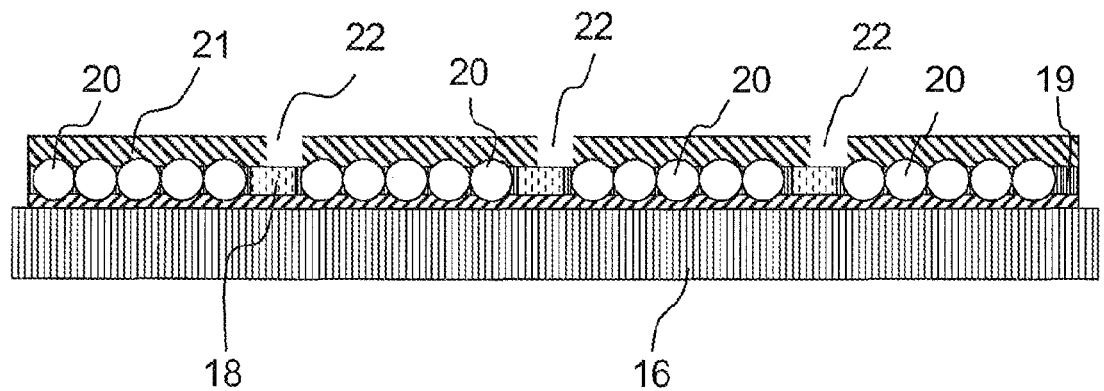

As is shown in FIG. 6, the transparent layer 21 is patterned by means of a processing station 6, if application has not already taken place in this patterned manner previously. This takes place accurately and inexpensively by using, for example, a laser. The recesses 22 thus obtained divide the transparent layer 21 into individual webs in such a way that each transparent web is electrically connected laterally only to a single electrically conductive polymer web 18, and conversely, each electrically conductive polymer web 18 is electrically connected to only a single electrically conductive transparent web 21.

Figure 7:
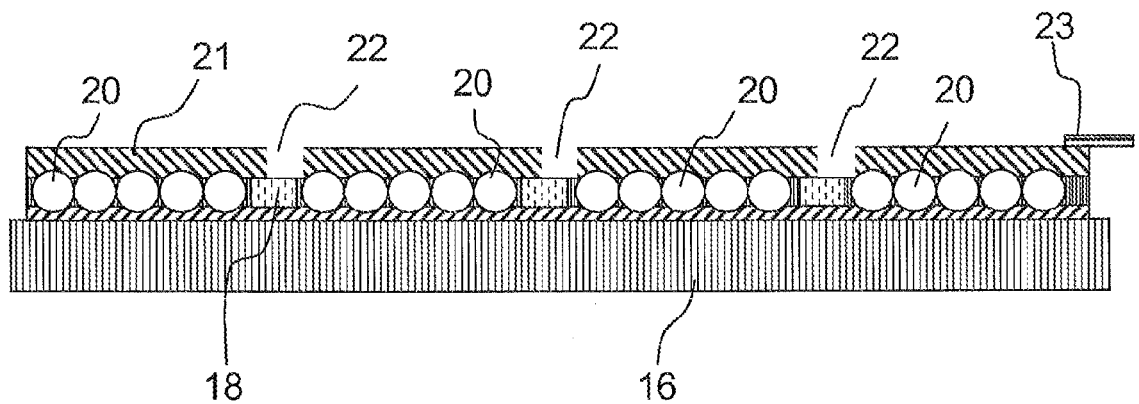

An electrically conductive strip 23 consisting, for example, of aluminum, is electrically connected on one side with an outer transparent web 21 in a station 7, as is illustrated by FIG. 7. The strip 23 is glued on, for example, with an electrically conductive adhesive or soldered on.

Figure 8:
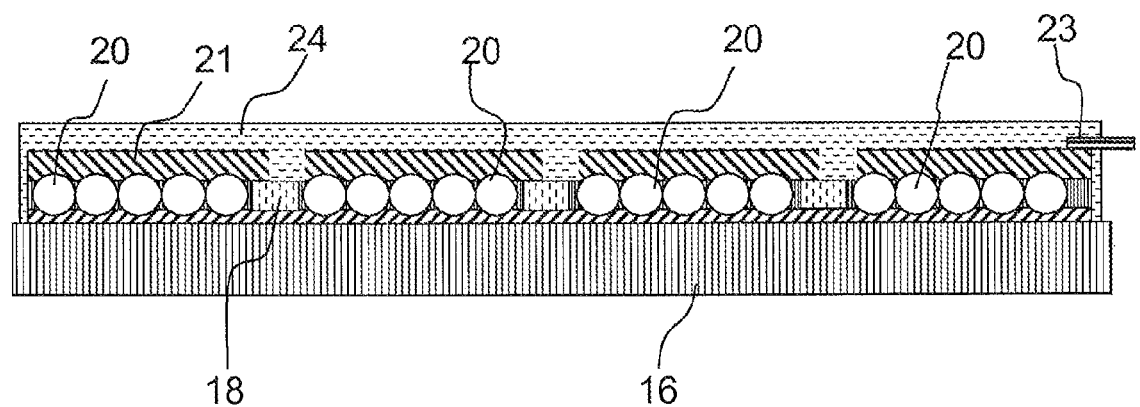

In a station 8 the surface is provided with a transparent electrically non-conductive adhesion layer 24 which provides the preconditions for being able to easily apply a subsequent protective layer. The adhesion layer can consist, for example, of PVA (polyvinyl acetate). The adhesion layer 24 can also cover lateral regions, as is illustrated by FIG. 8. The adhesion layer fills intermediate spaces and thus provides for a flat surface.

Figure 9:
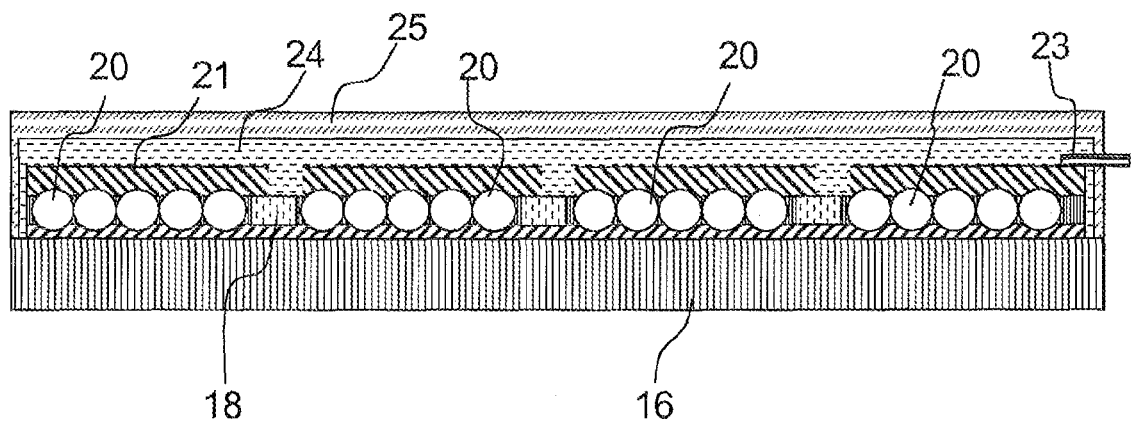
Figure 10:
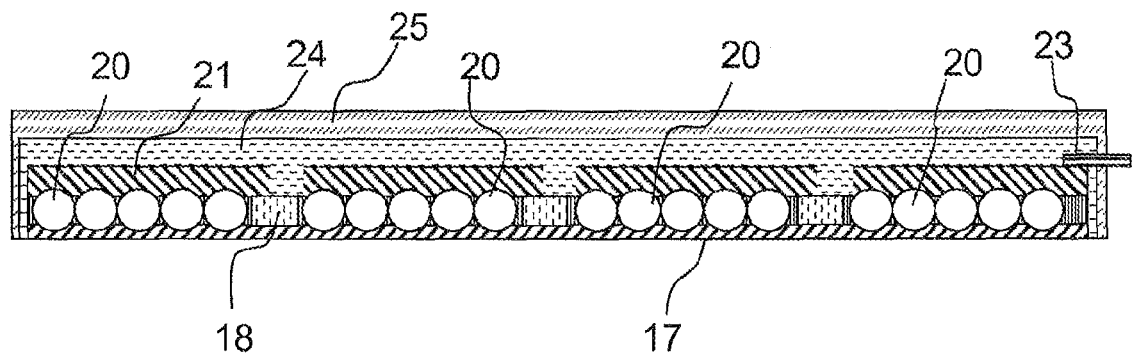
Figure 11:
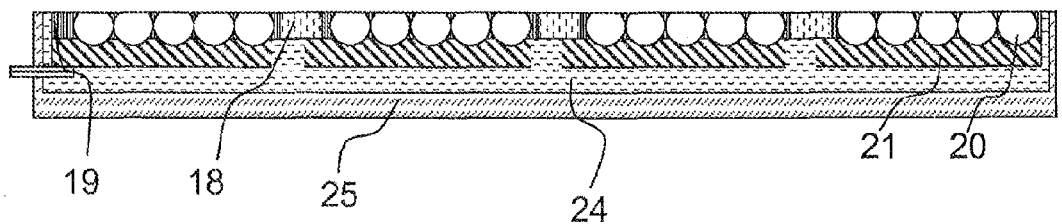

In order to encapsulate the solar cell, another protective layer 25 shown in FIG. 9 is laminated thereon, for example. This protective layer is firmly connected to the solar cells by means of the adhesion layer 24. The protective layer 25 offers protection against, in particular, moisture and oxygen. The protective layer consists in particular of a flexible high barrier film in order to be able to apply the protective layer continuously without any problems. In principle, glass is also suitable for suitably protecting solar cells against oxygen and moisture.

In a station 10, the carrier film 16 is removed which is easily possible in particular if the adhesive 17 is still soft, that is, not cured or completely cross-linked. This now provides the structure shown in cross-section in FIG. 10.

In a next station 11, the adhesive 17 is removed, for example by washing and/or brushing it off. Furthermore, the p-n coatings of the regions of the particles or grains 20 thus exposed are removed, for example by polishing, in order to make an ohmic contact possible. Moreover, the web is now rerouted in a downward direction and then fed further horizontally in the opposite direction in order to turn over the exposed polished grain surfaces and easily coat them. Prior to reaching the next station 12, the web is in the condition shown in FIG. 11.

Figure 12:
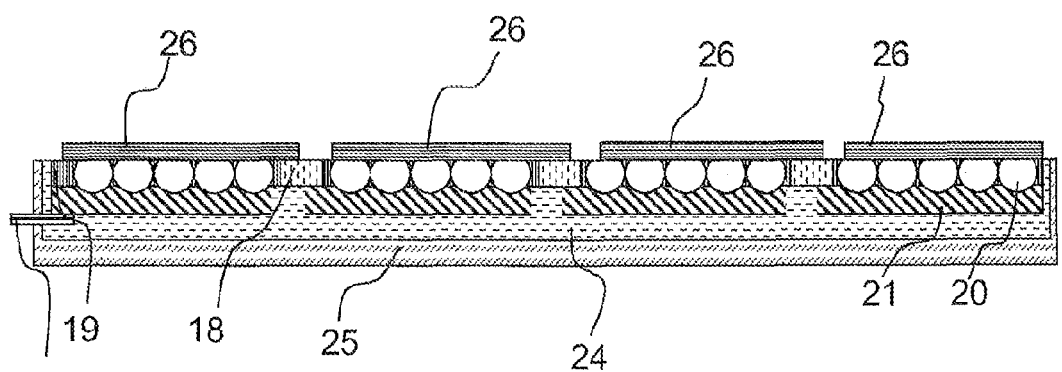
Figure 13:
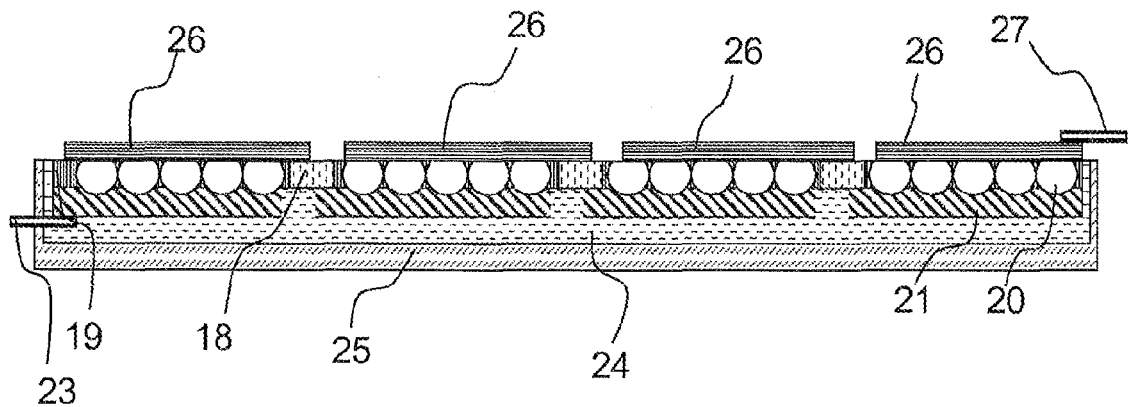
Figure 14:
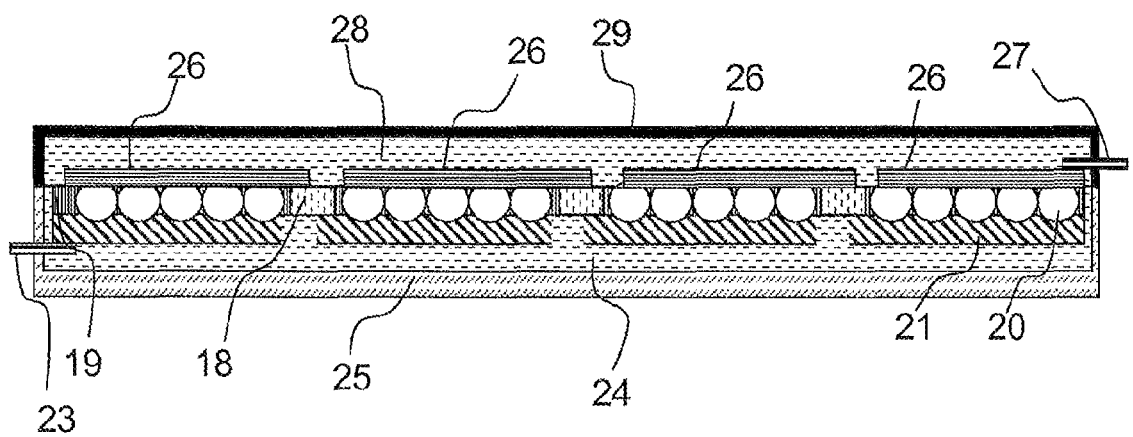

In the station 12, further electrical contacts 26 are printed on in a layered manner, for example with a pattern. However, an electrically conductive layer can also be applied over the entire surface first, and then patterned with a laser. There is now only an ohmic contact between the cores of the particles 20 and the contacts 26. The contacts 26 complete an electrical connection in series between the individual sections formed by an electrically non-conductive polymer layer 19 and particles 20 partially embedded therein. Each electrical contact 26 in turn is therefore electrically connected to only a single electrically conductive strip-like layer 18, and furthermore covers exactly a single laterally adjacent layer formed by electrically non-conductive polymer 19 and particles 20. The contacts 21 and 26 cover the web-like layers formed by electrically non-conductive polymer 19 and particles 20 as completely as possible, as FIG. 12 shows. However, a small marginal region not included by the contacts 26 as a rule remains. It is thus ensured that there is no further electrical connection to a second strip-like, electrically conductive layer 18. For the same reason, the electrically conductive, strip-like layers 18 as a rule are only partially covered by contacts 21 and 26 that adjoin above and below.

In a subsequent station 13, a further electrically conductive strip 27 is now applied so that the latter protrudes laterally. The strip 27 consists, for example, of aluminum or another metal, such as copper, and is located on the side opposite to the side comprising the electrically conductive strip 23 already attached. The application can take place in the manner already mentioned. The resulting situation is shown in cross-section in FIG. 13.

In the next processing station 14, the surface is now encapsulated by means of an adhesive 28, for example, and is additionally protected, preferably with an aluminum film 29, in a subsequent processing station 15. The film is selected such that it offers protection in particular against moisture and oxygen. It need not be transparent. If the film, for example a film consisting of aluminum, reflects, then an electromagnetic radiation can be reflected back in the direction of the solar cell in order thus to enhance the efficiency factor.

Finally, the web is divided into desired sizes in a cutting station (cutter).

Fabrication can take place completely continuously and ends with finished solar cells of a desired size. The laterally protruding electrically conductive strips 23 and 27 easily enable the interconnection of several solar cells produced in this fashion, or the connection to an electrical load.

The invention claimed is:

1. A method for the production of a monograin membrane, comprising the steps of:
    applying onto a sticky surface of a web-like carrier a layer of alternating non-conductive and conductive web-like layer sections respectively formed of an electrically non-conductive binder and an electrically conductive binder such that the non-conductive and conductive web-like layer sections are adjacent to one another on the sticky surface of the web-like carrier; then,
    introducing into the electrically non-conductive web-like layer sections through exposed surfaces thereof, grains provided with a coating for forming a p-n transition, such that the grains are disposed at the same level and extend at least to the sticky surface of the web-like carrier;
    covering the exposed surfaces of the electrically non-conductive web-like layer sections and exposed surfaces of the electrically conductive web-like layer sections in a web-like manner, section by section, with a transparent, electrically conductive material to form electrically conductive, transparent web-like sections of the electrically conductive transparent material that are each electrically connected only to a single underlying electrically conductive web-like layer section while each electrically conductive web-like layer section is electrically connected only to a single web-like, electrically conductive, transparent web-like section; then,
    removing the carrier with the sticky surface and the directly adjacent p-n coating of the grains to form an exposed grain surface;
    covering the exposed grain surface in a web-like manner and section by section with an electrically conductive material to form web-like electrically conductive sections each electrically connected only to a single electrically conductive web-like layer section while each electrically conductive web-like layer section is electrically connected only to a single web-like, electrically conductive section, and wherein two outer electrically conductive sections interconnected via an electrically conductive web-like layer section cover different electrically non-conductive web-like layer sections with protruding grains; and
    further comprising solidifying the electrical non-conductive binder and the electrically conductive binder.

2. The method according to claim 1, wherein the grains consist of a material which is capable of converting sunlight into electrical energy, at least part of the grains protrude from the electrically non-conductive web-like layer sections and comprise a p-n transition.

3. The method according to claim 2, wherein the non-conductive and conductive web-like layer sections are in the form of laterally adjacent strips with two electrically nonconductive strips being separated by an electrically conductive strip.

4. The method according to claim 3, wherein the electrically conductive strip has a no more than one third the width of the electrically non-conductive strips.

5. The method according to claim 2, wherein the monograin membrane is produced continuously in a web-like manner.

6. The method according to claim 1, wherein the of electrically non-conductive sections are applied at a thickness no greater than a diameter of the grains.

7. The method according to claim 1, wherein the grains consist of a material which is capable of converting sunlight into electrical energy.

* * * * *